(12) United States Patent
Dowlatkhah

(10) Patent No.: US 9,668,115 B2
(45) Date of Patent: *May 30, 2017

(54) SYSTEM AND METHOD FOR AUDIBLE TEXT CENTER SUBSYSTEM

(71) Applicant: Genesis Star Management Limited, Tortola (VG)

(72) Inventor: Sangar Dowlatkhah, Alpharetta, GA (US)

(73) Assignee: Genesis Star Management Limited, Tortola (VG)

( * ) Notice: Subject to any disclaimer, the term of this patent is extended or adjusted under 35 U.S.C. 154(b) by 0 days.

This patent is subject to a terminal disclaimer.

(21) Appl. No.: 14/929,519

(22) Filed: Nov. 2, 2015

(65) Prior Publication Data

US 2016/0057590 A1 Feb. 25, 2016

Related U.S. Application Data

(63) Continuation of application No. 13/826,013, filed on Mar. 14, 2013, now Pat. No. 9,177,555, which is a continuation of application No. 12/638,583, filed on Dec. 15, 2009, now Pat. No. 8,401,848.

(51) Int. Cl.
| | |
|---|---|
| H04W 4/14 | (2009.01) |
| H04M 3/53 | (2006.01) |
| H04W 4/18 | (2009.01) |
| G10L 13/00 | (2006.01) |
| H04M 1/725 | (2006.01) |
| G10L 15/26 | (2006.01) |
| G11C 11/56 | (2006.01) |
| G10L 13/08 | (2013.01) |
| H04L 12/58 | (2006.01) |
| H04W 4/12 | (2009.01) |
| H04W 76/02 | (2009.01) |

(52) U.S. Cl.
CPC ............... *H04W 4/14* (2013.01); *G10L 13/00* (2013.01); *G10L 13/08* (2013.01); *G10L 15/26* (2013.01); *G11C 11/5628* (2013.01); *H04M 1/72552* (2013.01); *H04M 3/5322* (2013.01); *H04W 4/18* (2013.01); *G11C 2211/5621* (2013.01); *H04L 12/5835* (2013.01); *H04L 51/066* (2013.01); *H04M 2201/39* (2013.01); *H04M 2201/40* (2013.01); *H04W 4/12* (2013.01); *H04W 76/02* (2013.01)

(58) Field of Classification Search
CPC ........ G10L 13/08; H04M 3/5322; H04W 4/14
USPC .......................................... 704/270; 455/466
See application file for complete search history.

(56) References Cited

U.S. PATENT DOCUMENTS

| | | |
|---|---|---|
| 6,233,318 B1 | 5/2001 | Picard et al. |
| 6,507,643 B1 | 1/2003 | Groner |
| 6,965,666 B1 | 11/2005 | Zhang |
| 6,981,023 B1 | 12/2005 | Hamilton et al. |

(Continued)

*Primary Examiner* — Susan McFadden

(57) ABSTRACT

A system, method, and computer-readable storage device for sending a spoken message as a text message. The method includes receiving from a subscriber a spoken message and spoken disambiguating information indicating how to deliver the spoken message to a recipient. The method further includes converting the spoken message to text and communicating the text to the recipient address. The method can also include determining a recipient address for the recipient based on spoken disambiguating information.

20 Claims, 6 Drawing Sheets

(56) References Cited

U.S. PATENT DOCUMENTS

| | | | |
|---|---|---|---|
| 7,069,301 B2 | 6/2006 | Jerbi et al. | |
| 7,136,902 B1 | 11/2006 | Ruckart | |
| 7,164,756 B1 | 1/2007 | Satapathy | |
| 7,315,613 B2 | 1/2008 | Kleindienst et al. | |
| 7,334,050 B2 | 2/2008 | Zondervan et al. | |
| 7,508,924 B2 * | 3/2009 | Owens | G06Q 10/107 379/93.15 |
| 7,684,787 B2 | 3/2010 | Qu et al. | |
| 8,031,846 B2 * | 10/2011 | Owens | G06Q 10/107 379/93.15 |
| 8,107,978 B2 | 1/2012 | Anderl et al. | |
| 8,130,917 B2 | 3/2012 | Helbling et al. | |
| 8,140,627 B2 | 3/2012 | Lasensky et al. | |
| 8,401,848 B2 | 3/2013 | Dowlatkhah | |
| 8,560,323 B2 | 10/2013 | Madhavapeddi et al. | |
| 9,177,555 B2 * | 11/2015 | Dowlatkhah | G10L 13/08 |

\* cited by examiner

SYSTEM AND METHOD FOR AUDIBLE TEXT CENTER SUBSYSTEM

PRIORITY INFORMATION

The present application is a continuation of U.S. patent application Ser. No. 13/826,013, filed Mar. 14, 2013, which is a continuation of U.S. patent application Ser. No. 12/638,583, filed Dec. 15, 2009, now U.S. Pat. No. 8,401,848, issued Mar. 19, 2013, the contents of which are incorporated herein by reference in their entirety.

BACKGROUND

1. Technical Field

The present disclosure relates to text messages and more specifically to a way to initiate and intercept text messages and send converted messages to subscribers in a speech format.

2. Introduction

Text messages, otherwise known as Short Message Service (SMS), began in 1992-93 as a way to send messages from a computer to a phone, and shortly thereafter allowed phone to phone messages. Because of its simplicity, text messages have become the most used cellular phone service after actual voice services. However, one large drawback with text messaging is that it typically occupies one or both hands and at least partially distracts the subscriber's eyes. In every day use, this is not very problematic, but when the subscriber is driving a vehicle or performing other attention intensive activities, typing a text message can be extremely dangerous. Text messaging while driving is often compared to drunk driving in terms of danger to self and others on the road. An increasing number of states have made texting while driving an illegal activity, punishable by a ticket and/or fine. Some solutions in the market today inhibit subscribers from sending or receiving a text message while driving a car, such as with GPS-enabled speed detection. However, these approaches to block SMS functionality have flaws because a detected moving speed does not accurately indicate whether a subscriber is a passenger or a driver of a car, or whether the subscriber is a passenger on a bus or a train. Current solutions either have serious flaws or do not allow subscribers to communicate via SMS safely while driving.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Instead of forcing SMS subscribers to stop using this very useful service, SMS communications should be safe to use while driving. The approach disclosed herein allows the millions of handsets already in use to safely send and/or receive text messages in such situations. A telecommunications provider can offer this safe SMS service for free as a public service or for a fee.

Throughout this disclosure, the following acronyms are used: ATCS—Audible Text Center Subsystem; CNR—Consolidated Network Repository; MSC—Mobile Switching Center; and SMSC—Short Message Service Center.

In an ATCS-based telecommunications network, the ATCS intercepts transmitted text messages and plays them back to a recipient upon request. When a recipient receives a text message while driving or in other situations when he or she does not want to or cannot take attention away from what he or she is doing, he or she can either push a button, issue a voice command, make a gesture, or provide other input to initiate the retrieval of text message in voice format (similar to voice mail) or use the same interface to send a text message without taking the attention from the road. This option can also be helpful for handicapped or elderly citizens who are unable to easily use a small mobile keyboard to text or who cannot easily read the small mobile display.

An ATCS can easily be integrated into existing telecommunications platforms, including the 3GPP network. Further, this approach operates without updating or changing existing handsets. Although a telephone manufacturer, mobile device operating systems developer, and/or a telecommunications provider could provide much more sophisticated customized widgets and applications to add value to this service and make it more accessible on newer mobile devices, a basic solution also works with all legacy handsets, potentially providing an immediate benefit to all telecommunications subscribers.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Figure 1:
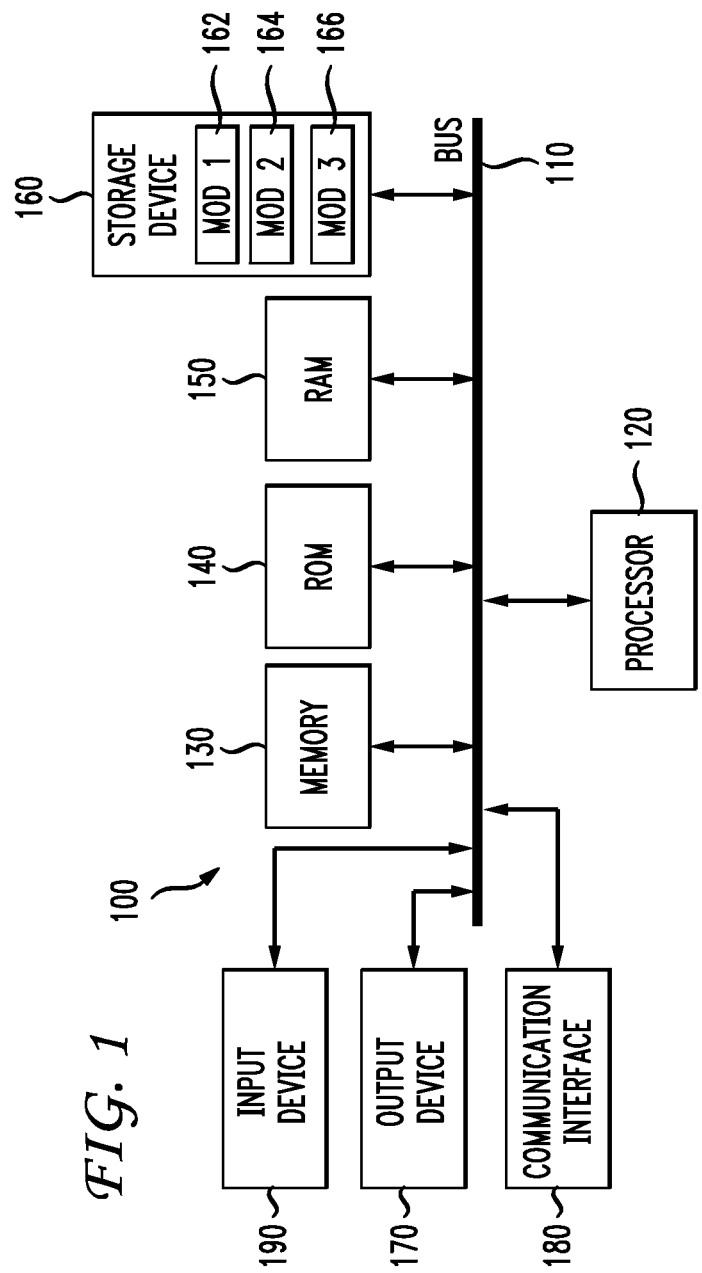
FIG. 1 illustrates an example system embodiment.

With reference to FIG. 1, an exemplary system 100 includes a general-purpose computing device 100, including a processing unit (CPU or processor) 120 and a system bus 110 that couples various system components including the system memory 130 such as read only memory (ROM) 140 and random access memory (RAM) 150 to the processor 120. These and other modules can be configured to control the processor 120 to perform various actions. Other system memory 130 may be available for use as well. It can be appreciated that the disclosure may operate on a computing device 100 with more than one processor 120 or on a group or cluster of computing devices networked together to provide greater processing capability. The processor 120 can include any general purpose processor and a hardware module or software module, such as module 1 162, module 2 164, and module 3 166 stored in storage device 160, configured to control the processor 120 as well as a special-purpose processor where software instructions are incorporated into the actual processor design. The processor 120 may essentially be a completely self-contained computing system, containing multiple cores or processors, a bus, memory controller, cache, etc. A multi-core processor may be symmetric or asymmetric.

The system bus 110 may be any of several types of bus structures including a memory bus or memory controller, a peripheral bus, and a local bus using any of a variety of bus architectures. A basic input/output (BIOS) stored in ROM 140 or the like, may provide the basic routine that helps to transfer information between elements within the computing device 100, such as during start-up. The computing device 100 further includes storage devices 160 such as a hard disk drive, a magnetic disk drive, an optical disk drive, tape drive or the like. The storage device 160 can include software modules 162, 164, 166 for controlling the processor 120. Other hardware or software modules are contemplated. The storage device 160 is connected to the system bus 110 by a drive interface. The drives and the associated computer readable storage media provide nonvolatile storage of computer readable instructions, data structures, program modules and other data for the computing device 100. In one aspect, a hardware module that performs a particular function includes the software component stored in a tangible and/or intangible computer-readable medium in connection with the necessary hardware components, such as the processor 120, bus 110, display 170, and so forth, to carry out the function. The basic components are known to those of skill in the art and appropriate variations are contemplated depending on the type of device, such as whether the device 100 is a small, handheld computing device, a desktop computer, or a computer server.

Although the exemplary embodiment described herein employs the hard disk 160, it should be appreciated by those skilled in the art that other types of computer readable media which can store data that are accessible by a computer, such as magnetic cassettes, flash memory cards, digital versatile disks, cartridges, random access memories (RAMs) 150, read only memory (ROM) 140, a cable or wireless signal containing a bit stream and the like, may also be used in the exemplary operating environment. Tangible computer-readable storage media expressly exclude media such as energy, carrier signals, electromagnetic waves, and signals per se.

To enable user interaction with the computing device 100, an input device 190 represents any number of input mechanisms, such as a microphone for speech, a touch-sensitive screen for gesture or graphical input, keyboard, mouse, motion input, speech and so forth. The input device 190 may be used by the presenter to indicate the beginning of a speech search query. An output device 170 can also be one or more of a number of output mechanisms known to those of skill in the art. In some instances, multimodal systems enable a user to provide multiple types of input to communicate with the computing device 100. The communications interface 180 generally governs and manages the user input and system output. There is no restriction on operating on any particular hardware arrangement and therefore the basic features here may easily be substituted for improved hardware or firmware arrangements as they are developed.

For clarity of explanation, the illustrative system embodiment is presented as including individual functional blocks including functional blocks labeled as a "processor" or processor 120. The functions these blocks represent may be provided through the use of either shared or dedicated hardware, including, but not limited to, hardware capable of executing software and hardware, such as a processor 120, that is purpose-built to operate as an equivalent to software executing on a general purpose processor. For example the functions of one or more processors presented in FIG. 1 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 140 for storing software performing the operations discussed below, and random access memory (RAM) 150 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 100 shown in FIG. 1 can practice all or part of the recited methods, can be a part of the recited systems, and/or can operate according to instructions in the recited tangible computer-readable storage media. Generally speaking, such logical operations can be implemented as modules configured to control the processor 120 to perform particular functions according to the programming of the module. For example, FIG. 1 illustrates three modules Mod1 162, Mod2 164 and Mod3 166 which are modules configured to control the processor 120. These modules may be stored on the storage device 160 and loaded into RAM 150 or memory 130 at runtime or may be stored as would be known in the art in other computer-readable memory locations.

Figure 2:
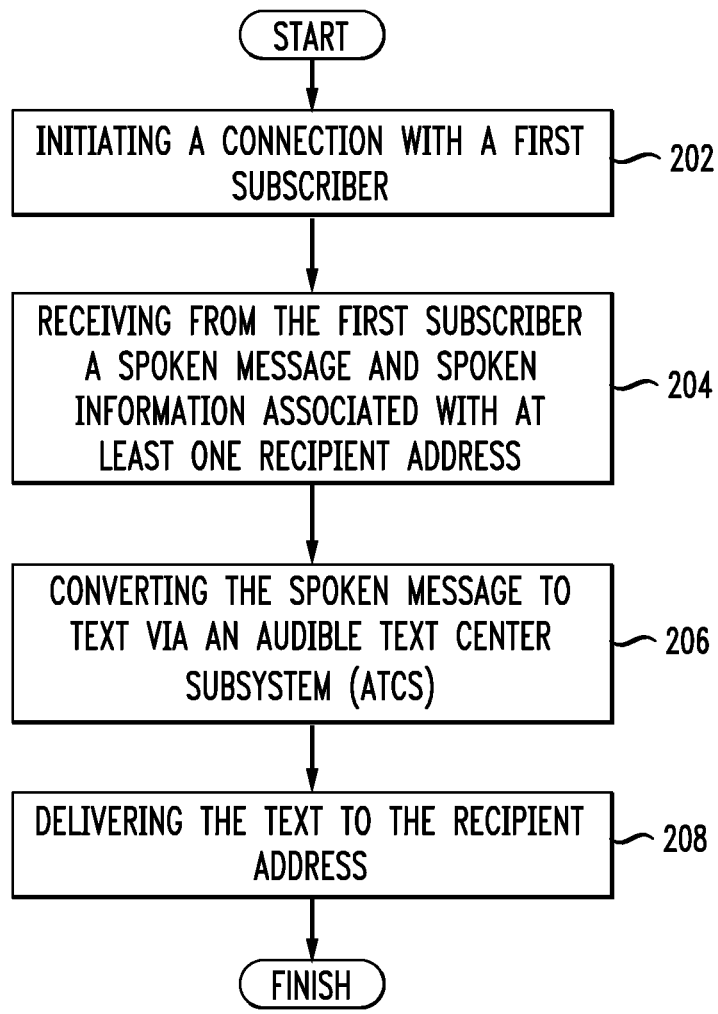
FIG. 2 illustrates an example method embodiment for sending a spoken message as a text message.

Having disclosed some basic system components, the disclosure now turns to the exemplary method embodiment shown in FIG. 2. For the sake of clarity, the method is discussed in terms of an exemplary system such as is shown in FIG. 1 configured to practice the method.

FIG. 2 illustrates an exemplary method embodiment for sending a spoken message as a text message. A system 100 practicing the method initiates a connection with a first subscriber (202). The system 100 can verify a subscription status of the first subscriber, to ensure that the first subscriber is allowed to send text messages, to establish a billing rate for converting a spoken message to a text or SMS message, and/or other purposes. In some cases, the system can retrieve delivery preferences of the first subscriber and deliver the text to the recipient address based on the retrieved preferences. For example, the first subscriber can establish a preference for transmitting spoken messages to a particular recipient via email during working hours and as an SMS after working hours. A consolidated network repository (CNR) can store such preferences. In some cases, the first subscriber embeds per-message preferences within the spoken message as oral instructions to the system. For example, the first subscriber can say "text this to John . . . " or "text this to Mary, email this to Jane, and send both a text and an email to George." The system 100 can retrieve these preferences and implement the delivery accordingly.

The system 100 receives from the first subscriber a spoken message and spoken information associated with at least one recipient address (204). The spoken information associated with at least one address can be a name in an address book, a phone number, email address, nickname, a name of a list of multiple addresses, and so forth. The system 100 can provide a spoken disambiguation dialog with the first subscriber. In one aspect, the system 100 delivers the text message to the recipient address based on delivery mode input from the first subscriber.

The system converts the spoken message to text via an audible text center subsystem (ATCS) (206). The ATCS can include a media converter module and a media storage module. In one aspect, the ATCS is a network element that makes it possible to convert text to speech and vice versa. This element can be a stand-alone platform or co-exist with a Short Message Service Center (SMSC), Visual VoiceMail (VVM), or other platforms. ATCS can consist of two main elements: a media converter and media storage. The media converter converts incoming text from the SMSC to speech and also converts the voice/speech from ATCS's voice storage center into text. The media storage stores the voice files generated by MCF and plays back the file to the recipient and also receives voice file from the subscriber and pushes it to the MCF for conversion and forwarding to SMSC for delivery as an SMS message to text recipient subscriber.

The system 100 then delivers the text to the recipient address (208). The system 100 can deliver both the spoken message and the text to the recipient address. In some cases, the system can also deliver the text via more than one method, such as email, SMS, Tweet, or other suitable text delivery methods. The system 100 can update recipient addresses based on received oral commands from the first subscriber. For example, the user can say, "Send this message to Suzie, but to her new phone number, not her old phone number." The system 100 can recognize the speech, look up Suzie's old number, and determine if she has a new mobile number, for example. In other aspects, the user specifies the new address (such as a new email address). In this way, the system converts the first subscriber's voice message to text via the ATCS, and notifies the recipient of the converted message in any of a number of delivery methods.

Figure 3:
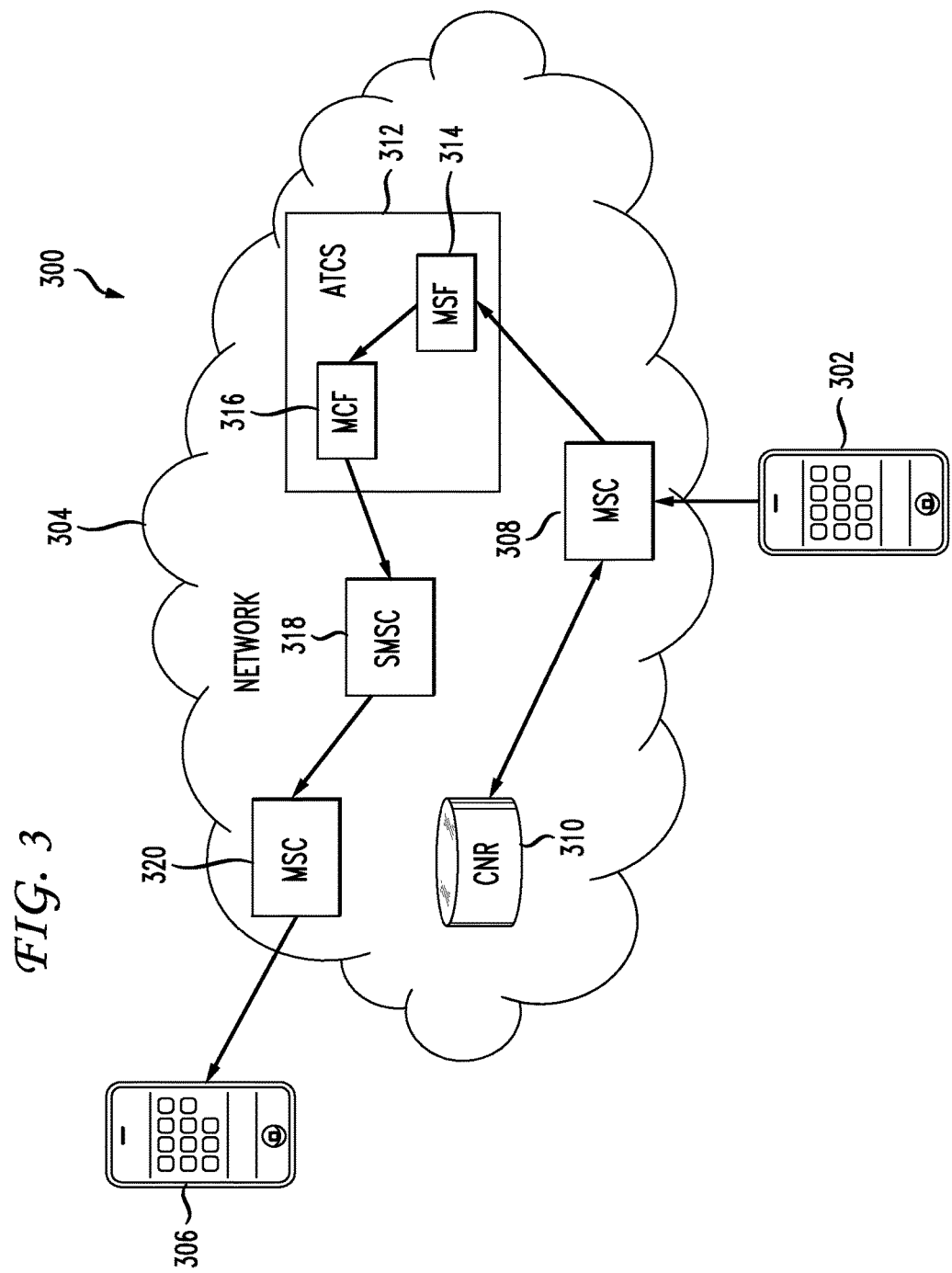
FIG. 3 illustrates an example system configuration for sending a text message.

FIG. 3 illustrates an example system configuration 300 for sending a text message as a voice message. A user 302 enters a text message using a keypad on a mobile device or other text entry mechanism, and submits the text message to a mobile switching center (MSC) 308 in a telecommunications network 304 for delivery to a recipient 306. The MSC 308 retrieves the user's profile from a consolidated network repository (CNR) 310 which includes the user's SMS possibilities, such as optional subscriber preferences on receiving voice text or regular text messages. This can be set as voice text message as a default option 1, and option 2 can be receiving a regular text message. Option 1 can also be triggered by a location-based service which can detect the subscriber's status with help of a built-in GPS in a mobile device and send the voice text as an override option or even send both text and voice text simultaneously. In that case, the recipient can select how to retrieve and/or store the message.

The CNR 310 returns all or part of the profile to the MSC 308, which forwards the SMS message based on the profile settings. For example, if option 1 (or the default option) is set, the MSC 308 can transfer the text message to the ATCS 312, which converts the text message to speech via a media converter 316 and stores the message (in speech and/or text form) via a media storage module 314. The ATCS 312 forwards a notification of the stored message to the short message service center (SMSC) 318, which can notify the recipient 306 of the speech converted from text in a similar manner as a regular voice mail notification. Upon request from the recipient, the SMSC 318 transfers the message to MSC 320 for delivery to the recipient 306 via a mobile handset or other telecommunications device. The recipient can request delivery via a Bluetooth interface, pushing an assigned button, making a touchscreen gesture, voice command, or by providing any other appropriate input. If option 2 is set, the MSC 308 transfers the text message directly to the SMSC 318 or to another destination, such as an email or HTTP server.

Figure 4:
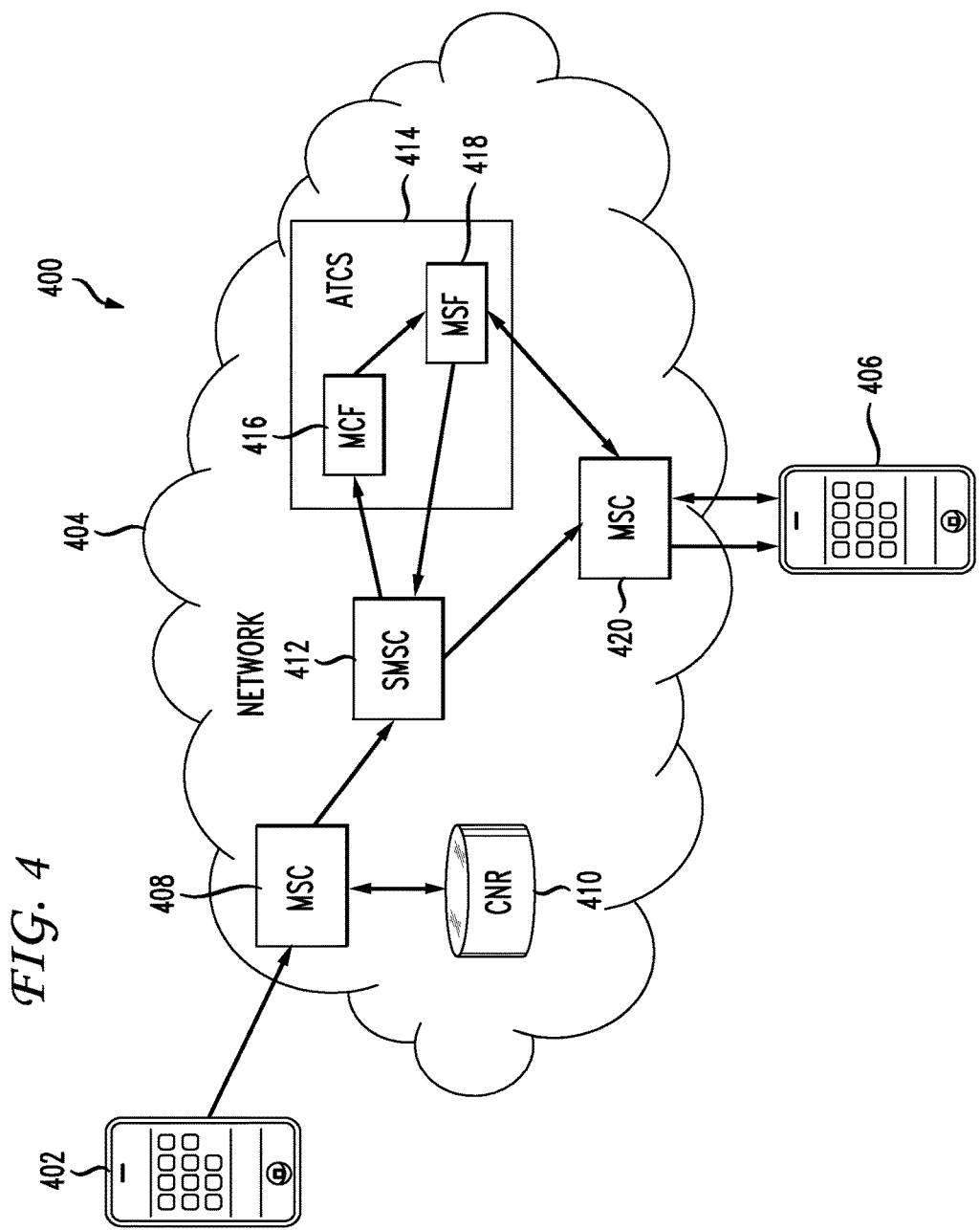
FIG. 4 illustrates an example system configuration for receiving a text message.

FIG. 4 illustrates an example system configuration 400 for receiving a text message. This system 100 can send an SMS without actually the user 402 typing the message. This approach can be useful when, for example, the user is driving and wants to send a text message. First, the user 402 initiates the connection with the MSC 408 to send a message to the recipient 406. The MSC 408 checks with a CNR 410 for subscription and/or permissions for that service. The CNR 410 confirms the subscription status of the user 402 and replies with appropriate options from a user profile. The MSC 408 sets up a connection to ATCS 414 through an SMSC 412. The ATSC 414 gathers the initial data from the user 402, including the user's phone number, actual message, and other metadata describing the message and/or the user 402. The MSF 418 forwards the stored voice message according to queuing and other parameters to MCF 416. The MCF 416 and MSF 418 convert and store the voice message to a text or SMS message and forward it to SMSC 412. The SMSC 412 treats this message as any other text message and sends it to MSC 420 for delivery to the recipient 406.

In one aspect, the recipient 406 has the option of replying to the message. The recipient 406 can initiate a reply message through an appropriate interface such as Bluetooth, pushing a button, etc. The recipient 406 can reply via text message, a spoken message converted to text, voicemail, a phone call, email, or other communication vehicles.

Figure 5:
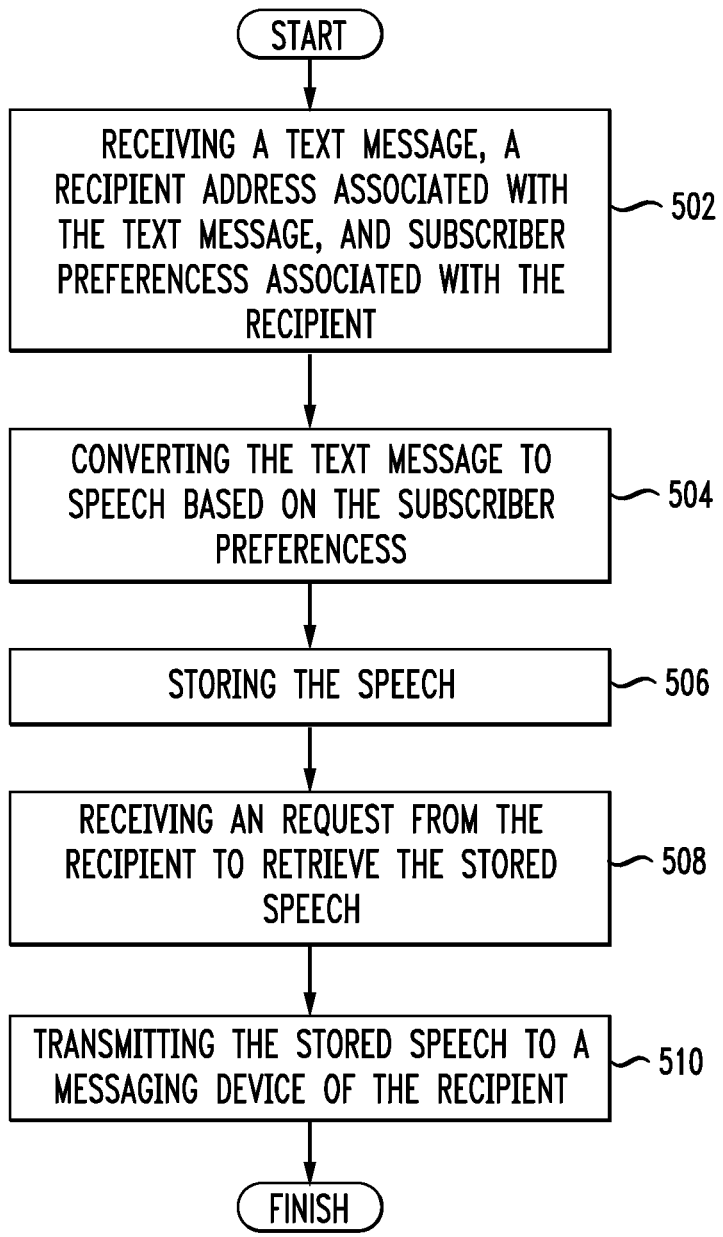
FIG. 5 illustrates an example method embodiment for converting text messages to voice.

FIG. 5 illustrates an example method embodiment for converting text messages to voice. A system configured to practice the method receives a text message, a recipient address associated with the text message, and subscriber preferences associated with the recipient (502). The system 100 can receive the text message from a first mobile switching center. The system 100 converts the text message to speech based on the subscriber preferences (504). The system 100 can retrieve subscriber preferences from one or both of a sender and a recipient. The system 100 stores the speech (506) in text and/or speech form. The system 100 receives a request from the recipient to retrieve the stored speech (508). The recipient can send the request in the same way as checking voicemail, for example. A more sophisticated software application can run on a smartphone allowing the user to browse through messages and select them for retrieval in a similar way as visual voicemail, for example. The system 100 transmits the stored speech to a messaging device of the recipient (510). The system 100 can further transmit a notification of the stored speech to the messaging device of the recipient in a similar manner to a voice mail notification. The system 100 can transmit the notification through a Short Message Service center.

Figure 6:
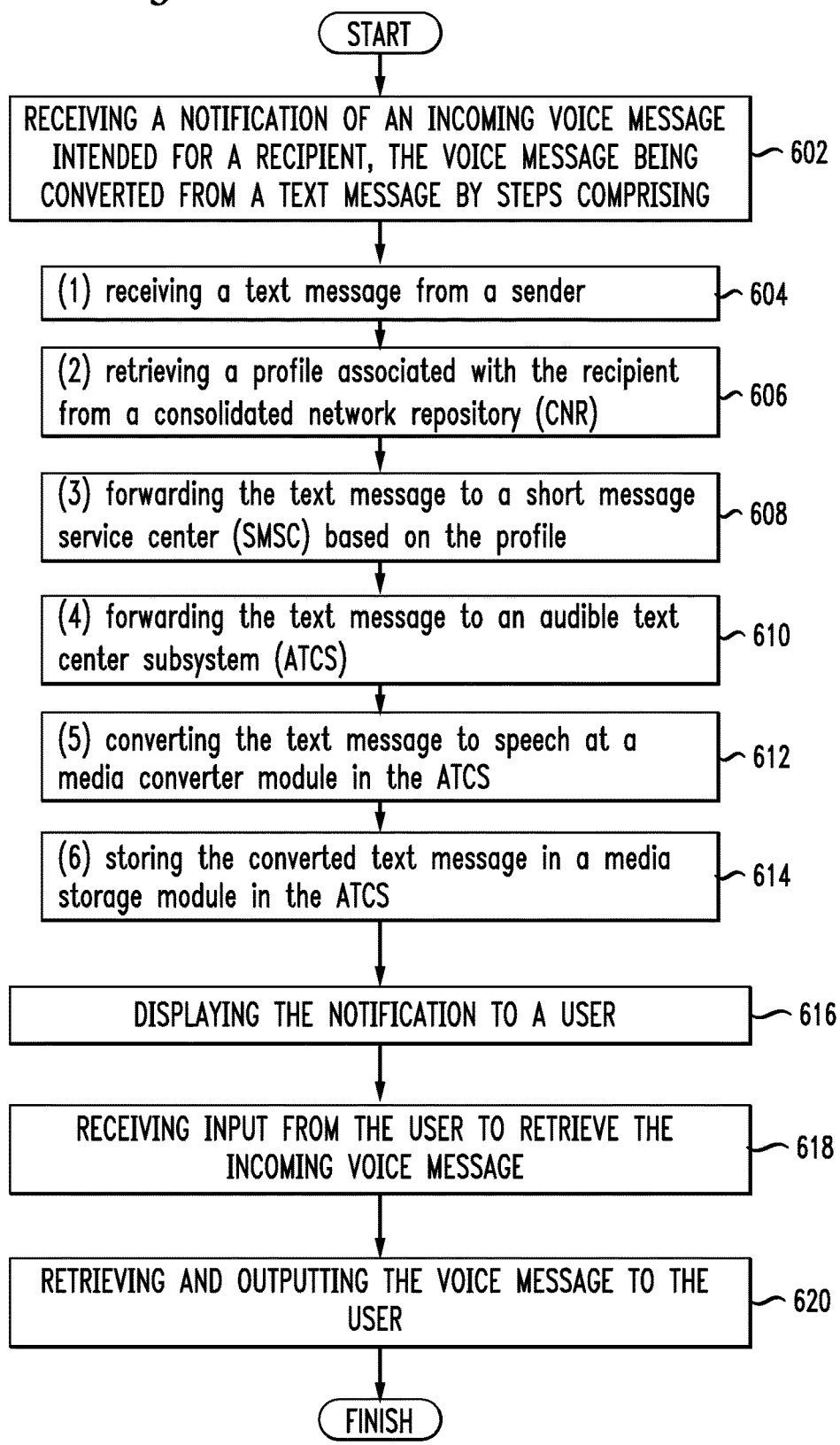
FIG. 6 illustrates an example method embodiment for receiving a text message as a voice message.

FIG. 6 illustrates an example method embodiment for receiving a text message as a voice message. A system 100 configured to practice the method receives a notification of an incoming voice message intended for a recipient (602), the voice message being converted from a text message by a converter system performing steps (604)-(614). A converter system first receives a text message from a sender (604) and retrieves a profile associated with the recipient from a consolidated network repository (CNR) (606). The user input can be received through a secondary communications device. In one aspect, converted text messages can be received through a non-mobile device, such as a land-line telephone. The profile can include recipient preferences for receiving voice text or a regular text message, as well as a default delivery address and other delivery addresses. The preferences can indicate a voice text message as a default setting, for example.

The converter system forwards the text message to a short message service center (SMSC) based on the profile (608) which can then forward the text message to an audible text center subsystem (ATCS) (610). A media converter in the ATCS converts the text message to speech (612) and stores the converted text message in a media storage module (614). At this point, the system 100 can display a notification to the recipient (616). The notification can be multimodal, meaning that more than one output method is used, such as a vibration in combination with a sound, or an LED notification with an automated speech message. The system 100 then receives input from the user to retrieve the incoming voice message (618) and retrieves and outputs the voice message to the user (620). In this way, the system converts the text message entered by the sender to a voice message retrievable by a recipient in the same manner as a voicemail. The system 100 can output the text message and the voice message to the recipient simultaneously. In one aspect, retrieving the voice message occurs before receiving input from the user to retrieve the voice message. The recipient can reply to the retrieved message via email, regular voicemail, voicemail converted to text, text message, or a return phone call.

Embodiments within the scope of the present disclosure may also include tangible computer-readable storage media for carrying or having computer-executable instructions or data structures stored thereon. Such computer-readable storage media can be any available media that can be accessed by a general purpose or special purpose computer, including the functional design of any special purpose processor as discussed above. By way of example, and not limitation, such computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those of skill in the art will appreciate that other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. Those skilled in the art will readily recognize various modifications and changes that may be made to the principles described herein without following the example embodiments and applications illustrated and described herein, and without departing from the spirit and scope of the disclosure.

I claim:

1. A method comprising:
    receiving, at a network server, a text message from a sender mobile device;
    receiving a recipient address associated with the text message;
    receiving subscriber preferences associated with a recipient of the text message;
    converting the text message to speech data based on the subscriber preferences;
    receiving a request from the recipient to retrieve the speech data; and
    communicating the speech data to a recipient mobile device associated with the recipient address.

2. The method of claim 1, further comprising verifying a subscription status of the recipient.

3. The method of claim 1, wherein the communicating of the speech data to the recipient mobile device is performed according to the subscriber preferences.

4. The method of claim 3, wherein the subscriber preferences are retrieved from a consolidated network repository.

5. The method of claim 1, wherein the text message is converted to speech data via an audible text center subsystem.

6. The method of claim 1, further comprising communicating the text message to the recipient mobile device.

7. The method of claim 6, wherein the communicating of the speech data and the communicating of the text message occur simultaneously.

8. A system comprising:
    a processor; and
    a computer-readable storage medium having instructions stored which, when executed by the processor, cause the processor to perform operations comprising:
        receiving, at a network server, a text message from a sender mobile device;
        receiving a recipient address associated with the text message;
        receiving subscriber preferences associated with a recipient of the text message;
        converting the text message to speech data based on the subscriber preferences;

receiving a request from the recipient to retrieve the speech data; and communicating the speech data to a recipient mobile device associated with the recipient address.

9. The system of claim 8, the computer-readable storage medium having additional instructions stored which, when executed by the processor, cause the processor to perform operations comprising verifying a subscription status of the recipient.

10. The system of claim 8, wherein the communicating of the speech data to the recipient mobile device is performed according to the subscriber preferences.

11. The system of claim 10, wherein the subscriber preferences are retrieved from a consolidated network repository.

12. The system of claim 8, wherein the text message is converted to speech data via an audible text center subsystem.

13. The system of claim 8, the computer-readable storage medium having additional instructions stored which, when executed by the processor, cause the processor to perform operations comprising communicating the text message to the recipient mobile device.

14. The system of claim 13, wherein the communicating of the speech data and the communicating of the text message occur simultaneously.

15. A computer-readable storage device having instructions stored which, when executed by a computing device, cause the computing device to perform operations comprising:

receiving, at a network server, a text message from a sender mobile device;

receiving a recipient address associated with the text message;

receiving subscriber preferences associated with a recipient of the text message;

converting the text message to speech data based on the subscriber preferences;

receiving a request from the recipient to retrieve the speech data; and communicating the speech data to a recipient mobile device associated with the recipient address.

16. The computer-readable storage device of claim 15, having additional instructions stored which, when executed by the computing device, cause the computing device to perform operations comprising verifying a subscription status of the recipient.

17. The computer-readable storage device of claim 15, wherein the communicating of the speech data to the recipient mobile device is performed according to the subscriber preferences.

18. The computer-readable storage device of claim 17, wherein the subscriber preferences are retrieved from a consolidated network repository.

19. The computer-readable storage device of claim 15, wherein the text message is converted to speech data via an audible text center subsystem.

20. The computer-readable storage device of claim 15, having additional instructions stored which, when executed by the computing device, cause the computing device to perform operations comprising communicating the text message to the recipient mobile device.

* * * * *